US007223626B2

(12) United States Patent
Farnworth et al.

(10) Patent No.: US 7,223,626 B2
(45) Date of Patent: May 29, 2007

(54) SPACERS FOR PACKAGED MICROELECTRONIC IMAGERS AND METHODS OF MAKING AND USING SPACERS FOR WAFER-LEVEL PACKAGING OF IMAGERS

(75) Inventors: Warren M. Farnworth, Nampa, ID (US); Alan G. Wood, Boise, ID (US); James M. Wark, Boise, ID (US); David R. Hembree, Boise, ID (US); Rickie C. Lake, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/922,192

(22) Filed: Aug. 19, 2004

(65) Prior Publication Data
US 2006/0040421 A1    Feb. 23, 2006

(51) Int. Cl.
*H01L 21/00* (2006.01)
(52) U.S. Cl. .................................. 438/64; 257/E21.499
(58) Field of Classification Search ................... 438/57, 438/5, 7, 10–11, 14, 16–18, 22–24, 29, 34, 438/36, 64, 128, 130, 149, 484
See application file for complete search history.

(56) References Cited
U.S. PATENT DOCUMENTS

| | | |
|---|---|---|
| 3,345,134 A | 10/1967 | Heymer et al. |
| 4,534,100 A | 8/1985 | Lane |
| 4,906,314 A | 3/1990 | Farnworth et al. |
| 5,130,783 A | 7/1992 | McLellan |
| 5,371,397 A | 12/1994 | Maegawa et al. |

(Continued)

FOREIGN PATENT DOCUMENTS

EP    0 886 323    12/1998

(Continued)

OTHER PUBLICATIONS

U.S. Appl. No. 10/785,466, Kirby.

(Continued)

*Primary Examiner*—Michael Lebentritt
*Assistant Examiner*—Andre' Stevenson
(74) *Attorney, Agent, or Firm*—Dickstein Shapiro LLP

(57) ABSTRACT

Methods of packaging microelectronic imagers and packaged microelectronic imagers. An embodiment of such a method can include providing an imager workpiece having a plurality of imager dies arranged in a die pattern and providing a cover substrate through which a desired radiation can propagate. The imager dies include image sensors and integrated circuitry coupled to the image sensors. The method further includes providing a spacer having a web that includes an adhesive and has openings arranged to be aligned with the image sensors. For example, the web can be a film having an adhesive coating, or the web itself can be a layer of adhesive. The method continues by assembling the imager workpiece with the cover substrate such that (a) the spacer is between the imager workpiece and the cover substrate, and (b) the openings are aligned with the image sensors. The attached web is not cured after the imager workpiece and the cover substrate have both been adhered to the web. As such, the web does not outgas contaminants into the compartments in which the image sensors are housed.

37 Claims, 5 Drawing Sheets

U.S. PATENT DOCUMENTS

| | | | |
|---|---|---|---|
| 5,424,573 A | 6/1995 | Kato et al. | |
| 5,435,887 A | 7/1995 | Rothschild et al. | |
| 5,505,804 A | 4/1996 | Mizuguchi et al. | |
| 5,560,047 A | 10/1996 | Shimada | |
| 5,593,913 A | 1/1997 | Aoki | |
| 5,605,783 A | 2/1997 | Revelli et al. | |
| 5,672,519 A | 9/1997 | Song et al. | |
| 5,694,246 A | 12/1997 | Aoyama et al. | |
| 5,708,293 A | 1/1998 | Ochi et al. | |
| 5,771,158 A | 6/1998 | Yamagishi et al. | |
| 5,776,824 A | 7/1998 | Farnworth et al. | |
| 5,811,799 A | 9/1998 | Wu | |
| 5,821,532 A | 10/1998 | Beaman et al. | |
| 5,857,963 A | 1/1999 | Pelchy et al. | |
| 5,861,654 A | 1/1999 | Johnson | |
| 5,877,040 A | 3/1999 | Park et al. | |
| 5,897,338 A | 4/1999 | Kaldenberg | |
| 5,914,488 A | 6/1999 | Sone | |
| 5,977,535 A | 11/1999 | Rostoker | |
| 5,998,862 A | 12/1999 | Yamanaka | |
| 6,080,291 A | 6/2000 | Woodruff et al. | |
| 6,104,086 A | 8/2000 | Ichikawa et al. | |
| 6,114,240 A | 9/2000 | Akram et al. | |
| 6,143,588 A | 11/2000 | Glenn | |
| 6,236,046 B1 | 5/2001 | Watabe et al. | |
| 6,259,083 B1 | 7/2001 | Kimura | |
| 6,266,197 B1 | 7/2001 | Glenn et al. | |
| 6,274,927 B1 | 8/2001 | Glenn | |
| 6,285,064 B1 | 9/2001 | Foster | |
| 6,351,027 B1 | 2/2002 | Giboney et al. | |
| 6,372,548 B2 | 4/2002 | Bessho et al. | |
| 6,407,381 B1 | 6/2002 | Glenn et al. | |
| 6,411,439 B2 | 6/2002 | Nishikawa | |
| 6,424,417 B1* | 7/2002 | Cohen et al. | 356/388 |
| 6,472,247 B1* | 10/2002 | Andoh et al. | 438/64 |
| 6,483,652 B2 | 11/2002 | Nakamura | |
| 6,503,780 B1 | 1/2003 | Glenn et al. | |
| 6,541,762 B2 | 4/2003 | Knag et al. | |
| 6,566,745 B1 | 5/2003 | Beyne et al. | |
| 6,603,183 B1 | 8/2003 | Hoffman | |
| 6,617,623 B2 | 9/2003 | Rhodes | |
| 6,661,047 B2 | 12/2003 | Rhodes | |
| 6,667,551 B2 | 12/2003 | Hanaoka et al. | |
| 6,670,986 B1 | 12/2003 | Ben Shoshan et al. | |
| 6,686,588 B1 | 2/2004 | Webster et al. | |
| 6,703,310 B2 | 3/2004 | Mashino et al. | |
| 6,864,172 B2 | 4/2004 | Noma et al. | |
| 6,734,419 B1 | 5/2004 | Glenn et al. | |
| 6,759,266 B1 | 7/2004 | Hoffman | |
| 6,774,486 B2 | 8/2004 | Kinsman | |
| 6,778,046 B2 | 8/2004 | Stafford et al. | |
| 6,791,076 B2 | 9/2004 | Webster | |
| 6,795,120 B2 | 9/2004 | Takagi et al. | |
| 6,797,616 B2 | 9/2004 | Kinsman | |
| 6,800,943 B2 | 10/2004 | Adachi | |
| 6,813,154 B2 | 11/2004 | Diaz et al. | |
| 6,825,458 B1 | 11/2004 | Moess et al. | |
| 6,828,663 B2 | 12/2004 | Chen et al. | |
| 6,828,674 B2 | 12/2004 | Karpman | |
| 6,844,978 B2 | 1/2005 | Harden et al. | |
| 6,882,021 B2 | 4/2005 | Boon et al. | |
| 6,885,107 B2 | 4/2005 | Kinsman | |
| 6,934,065 B2 | 8/2005 | Kinsman | |
| 6,946,325 B2 | 9/2005 | Yean et al. | |
| 2002/0006688 A1 | 1/2002 | Lam | |
| 2002/0057467 A1 | 5/2002 | Segawa et al. | |
| 2002/0089025 A1 | 7/2002 | Chou | |
| 2002/0096729 A1 | 7/2002 | Tu et al. | |
| 2002/0113296 A1 | 8/2002 | Cho et al. | |
| 2002/0145676 A1 | 10/2002 | Kuno et al. | |
| 2003/0062601 A1 | 4/2003 | Harnden et al. | |
| 2004/0012698 A1 | 1/2004 | Suda et al. | |
| 2004/0023469 A1 | 2/2004 | Suda | |
| 2004/0038442 A1 | 2/2004 | Kinsman | |
| 2004/0041261 A1 | 3/2004 | Kinsman | |
| 2004/0082094 A1 | 4/2004 | Yamamoto | |
| 2004/0214373 A1 | 10/2004 | Jiang et al. | |
| 2004/0245649 A1 | 12/2004 | Imaoka | |
| 2005/0052751 A1 | 3/2005 | Liu et al. | |
| 2005/0104228 A1 | 5/2005 | Rigg et al. | |
| 2005/0110889 A1 | 5/2005 | Tuttle et al. | |
| 2005/0127478 A1 | 6/2005 | Hiatt et al. | |
| 2005/0151228 A1 | 7/2005 | Tanida et al. | |
| 2005/0156301 A1* | 7/2005 | Shiu et al. | 257/678 |
| 2005/0236708 A1 | 10/2005 | Farnworth et al. | |
| 2005/0253213 A1* | 11/2005 | Jiang et al. | 257/433 |
| 2005/0254133 A1 | 11/2005 | Akram et al. | |
| 2006/0024856 A1* | 2/2006 | Derderian et al. | 438/57 |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59191388 | 10/1984 |
| JP | 07-263607 A | 10/1995 |
| JP | 2001-077496 A | 3/2001 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/925,406, Oliver.
U.S. Appl. No. 10/925,501, Oliver.
U.S. Appl. No. 10/925,502, Watkins et al.
U.S. Appl. No. 10/927,550, Derderian et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.

Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.

Blackburn, J.M. et al., "Deposition of Conformal Copper and Nickel Films from Supercritical Carbon Dioxide," Science, vol. 294, pp. 141-145, Oct. 5, 2001.

Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

* cited by examiner

SPACERS FOR PACKAGED MICROELECTRONIC IMAGERS AND METHODS OF MAKING AND USING SPACERS FOR WAFER-LEVEL PACKAGING OF IMAGERS

TECHNICAL FIELD

The methods and devices described below are related to packaging microelectronic imagers having solid state image sensors. More specifically, several embodiments of the invention are related to wafer-level packaging of microelectronic imagers by attaching an imager workpiece on one side of a prefabricated spacer and attaching a cover substrate on an opposing side of the spacer.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other solid state systems. CCD image sensors have been widely used in digital cameras and other applications. CMOS image sensors are also quickly becoming very popular because they are expected to have low production costs, high yields and small sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

FIG. 1 is a schematic view of a conventional microelectronic imager 1 with a conventional package. The imager 1 includes a die 10, an interposer substrate 20 attached to the die 10, and a spacer 30 attached to the interposer substrate 20. The spacer 30 surrounds the periphery of the die 10 and has an opening 32. The imager 1 also includes a transparent cover 40 over the die 10.

The die 10 includes an image sensor 12 and a plurality of bond-pads 14 electrically coupled to the image sensor 12. The interposer substrate 20 is typically a dielectric fixture having a plurality of bond-pads 22, a plurality of ball-pads 24, and traces 26 electrically coupling bond-pads 22 to corresponding ball-pads 24. The ball-pads 24 are arranged in an array for surface mounting the imager 1 to a board or module of another device. The bond-pads 14 on the die 10 are electrically coupled to the bond-pads 22 on the interposer substrate 20 by wire-bonds 28 to provide electrical pathways between the bond-pads 14 and the ball-pads 24.

The imager 1 shown in FIG. 1 also has an optics unit including a support 50 attached to the transparent cover 40 and a barrel 60 adjustably attached to the support 50. The support 50 can include internal threads 52, and the barrel 60 can include external threads 62 engaged with the threads 52. The optics unit also includes a lens 70 carried by the barrel 60.

One aspect of fabricating the imager 1 is forming the spacer 30 and attaching the cover 40 to the spacer 30. The spacer 30 can be formed by placing an uncured, flowable epoxy onto the interposer substrate 20. In a typical application, the interposer substrate 20 has a plurality of separate dies 10, and the spacer 30 is formed as a grid of uncured epoxy on the interposer substrate 20 in the areas between adjacent dies 10. After depositing the epoxy, the cover 40 is attached to the spacer 30. The epoxy is then cured to harden the spacer 30 such that it becomes dimensionally stable after enclosing the die 10 between the cover 40 and the interposer substrate 20.

One problem of forming the spacer 30 by stenciling an uncured epoxy on the interposer substrate is that the stenciling process produces a textured surface on the top surface of the spacer 30. This can lead to leaks between the spacer 30 and the cover 40 through which moisture or other contaminants can enter into the cavity where the image sensor 12 is located. Another problem of forming the spacer 30 by stenciling an uncured epoxy onto the substrate is that the height of the spacer 30 is limited because the epoxy tends to slump after the stencil is removed. This causes the epoxy to flow laterally and occupy a significant percentage of the real estate on the substrate 20. Additionally, a significant problem of using an uncured epoxy is that the uncured epoxy outgases during the curing cycle after the cover is mounted to the epoxy. Such outgasing can contaminate the compartment and impair or ruin the performance of the die 10.

Another process for forming the spacer 30 is to dispense a small flow of uncured epoxy via a needle-like tube or nozzle between adjacent dies. This process is undesirable because it is difficult to control the flow of the uncured epoxy at the intersections of the grid. The intersections typically have rounded corners that occupy additional real estate on the interposer substrate. Additionally, as with the stencil printing process, the epoxy is cured after the cover 40 is mounted to the spacer 30 such that it outgases into the image sensor compartment. Therefore, processes that dispense an epoxy using needle-like tubes are also undesirable.

U.S. Pat. No. 6,285,064 discloses another process in which a preformed adhesive matrix is fabricated in the shape of a wafer. The adhesive matrix has openings in the pattern of the image sensors, and it is formed separately from the wafer. In operation, the adhesive matrix is attached to the wafer such that the openings are aligned with the microlenses, and a cover glass is then attached to the top of the adhesive matrix. The adhesive matrix is subsequently activated by application of light, pressure and/or heat.

DETAILED DESCRIPTION

A. Overview

Figure 1:
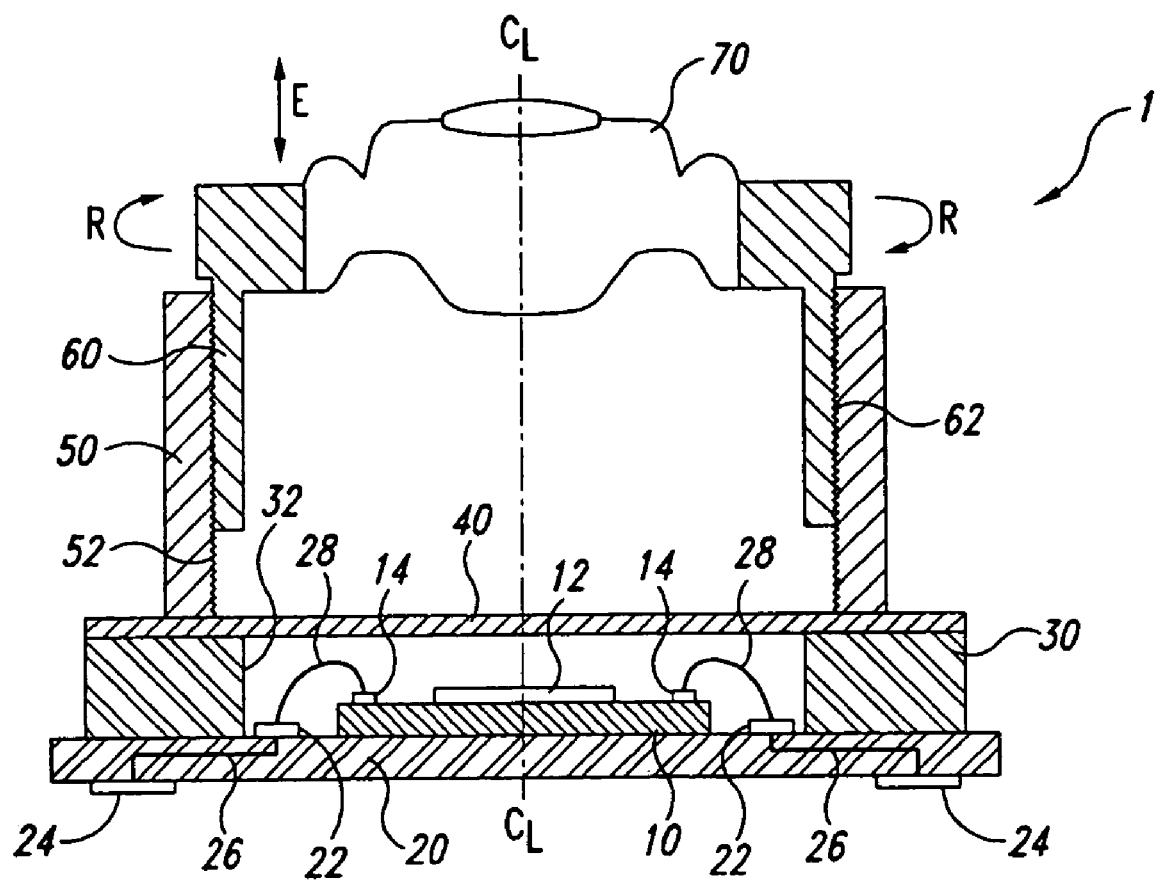
FIG. 1 is a cross-sectional view of a packaged microelectronic imager in accordance with the prior art.

The following disclosure describes several embodiments of (1) spacers for use in wafer-level packaging of microelectronic imagers, (2) microelectronic imagers including such spacers, (3) methods for wafer-level packaging of microelectronic imagers, and (4) methods for producing or otherwise providing prefabricated spacers for use in microelectronic imagers. Wafer-level packaging of microelectronic imagers is expected to significantly enhance the efficiency of manufacturing imaging devices because a plurality of imagers can be packaged simultaneously using highly accurate and efficient processes developed for packaging semiconductor devices. Wafer-level packaging of microelectronic imagers is also expected to enhance the quality and performance of such imagers because the semiconductor fabrication processes can reliably produce and assemble the various components with a high degree of precision. As such, several embodiments of wafer-level packaging processes for packaging microelectronic imagers and the imagers packaged using such processes disclosed herein are expected to significantly reduce the cost for assembling microelectronic imagers, increase the performance of imaging devices, produce smaller imagers compared to conventional devices, and produce higher quality imagers.

One aspect of the invention is directed toward methods of packaging microelectronic imagers. An embodiment of such a method can include providing an imager workpiece having a plurality of imager dies arranged in a die pattern and providing a cover substrate through which a desired radiation can propagate. The imager dies include image sensors and integrated circuitry coupled to the image sensors. The method further includes providing a spacer having a web that includes an adhesive and has openings arranged to be aligned with the image sensors. For example, the web can be a film having an adhesive coating, or the web itself can be a layer of adhesive. The method continues by assembling the imager workpiece with the cover substrate such that (a) the spacer is between the imager workpiece and the cover substrate, and (b) the openings are aligned with the image sensors. The attached web is not cured after the imager workpiece and the cover substrate have both been adhered to the web. As such, the web does not outgas contaminants into the compartments in which the image-sensors are housed.

Another embodiment of a method for packaging a plurality of imager dies includes forming a spacer having a web including an adhesive and a plurality of openings arranged in a die pattern corresponding to the pattern of individual imager dies on an imager workpiece. This embodiment further includes (a) adhering the imager workpiece to one side of the spacer with the image sensors being aligned with the openings, and (b) adhering a cover substrate to an opposite side of the spacer such that the image sensors are enclosed in individual compartments within the openings in the web. In this embodiment, the web is not cured after the imager workpiece and the cover substrate have both been adhered to the spacer.

Still another embodiment of a method in accordance with the invention is directed toward assembling an imager workpiece having a plurality of imager dies arranged in a die pattern with an optically transmissive cover substrate. The individual imager dies include an image sensor and an integrated circuit operatively coupled to the image sensor. This embodiment comprises prefabricating a spacer having a web with a desired thickness to space the imager workpiece apart from the cover substrate by a desired distance, openings arranged in the die pattern, a substantially flat first side, and a substantially flat second side. The web is in a non-flowable state before enclosing the image sensor between the imager workpiece and the cover substrate. This method further includes sealing (a) the imager workpiece to the first side of the web such that individual image sensors are aligned with a corresponding opening in the web, and (b) sealing the cover substrate to the second side of the web opposite the first side to enclose the image sensors between the imager workpiece and the cover substrate.

Another aspect of the invention is directed toward producing a spacer for separating the imager workpiece from the cover substrate by desired distance. This method comprises producing a non-flowable film having a first flat surface and a second flat surface spaced apart from the first flat surface by a thickness at least approximately equal to the desired distance between the imager workpiece and the cover substrate. The method continues by forming holes in the non-flowable film in the die pattern. The method can further include coating the film with an adhesive.

Additional aspects of the invention are directed toward microelectronic imager assemblies. In one embodiment, a microelectronic imager assembly comprises an imager workpiece having a plurality of imager dies arranged in a die pattern and a cover substrate. The individual imager dies include an image sensor and an integrated circuit operatively coupled to the image sensor. The cover substrate can be an optically transmissive plate, or it can be transmissive to another type of radiation in an operating spectrum of the image sensors. The imager assembly further includes a spacer. In one embodiment, the spacer has an integral web with a first side adhered to the workpiece, a second side spaced apart from the first side by a prefabricated separation distance and adhered to the cover substrate, and openings arranged in the die pattern and aligned with corresponding image sensors. This embodiment of the web includes a material in a cured, non-flowable state before the imager workpiece and the cover substrate are both adhered to the spacer. In another embodiment, the spacer is a prefabricated web including a plurality of cut-edged openings arranged in the die pattern and aligned with the image sensors. The web further includes a first side adhered to the imager workpiece, a second side adhered to the cover substrate, and a thickness that spaces the image sensors apart from the cover substrate by a desired distance.

Specific details of several embodiments of the invention are described below with reference to CMOS imagers to provide a thorough understanding of these embodiments, but other embodiments can use CCD imagers or other types of solid state imaging devices. Several details describing structures or processes that are well known and often associated with other types of microelectronic devices are not set forth in the following description for purposes of brevity. Moreover, although the following disclosure sets forth several embodiments of different aspects of the invention, several other embodiments of the invention can have different configurations or different components than those described in this section. As such, it should be understood that the invention may have other embodiments with additional elements or without several of the elements described below with reference to FIGS. 2–7B.

B. Wafer-Level Packaged Microelectronic Imagers

Figure 2:
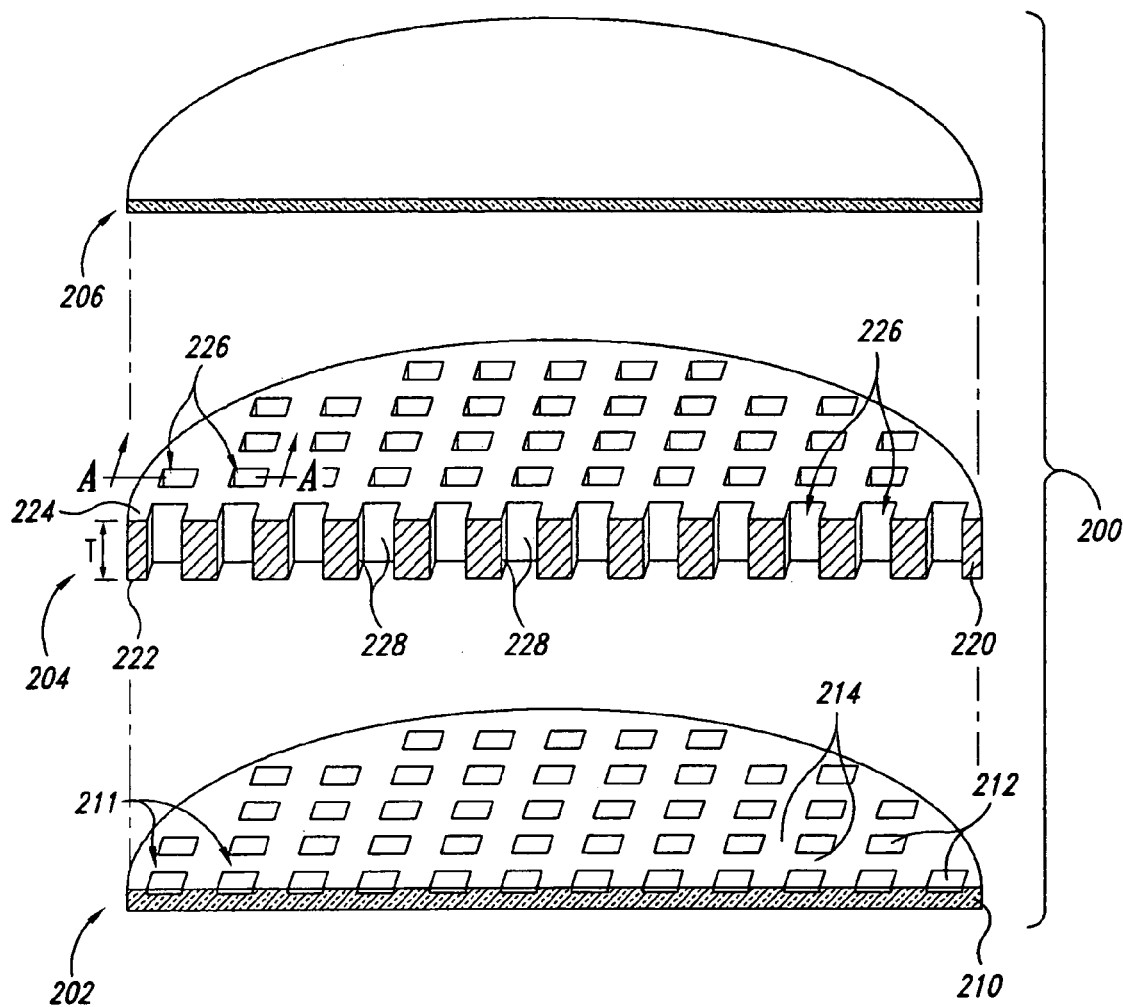
FIG. 2 is an exploded cross-sectional isometric view of an imager assembly having a plurality of microelectronic imagers that have been packaged at the wafer level in accordance with an embodiment of the invention.

FIG. 2 is an exploded, cross-sectional isometric view of an imager assembly 200 in accordance with an embodiment of the invention. In this embodiment, the imager assembly includes an imager workpiece 202, a spacer 204, and a cover substrate 206. The imager workpiece 202 includes a first substrate 210, a plurality of imager dies 211 having image sensors 212 arranged in a die pattern on the first substrate 210, and lanes 214 between the image sensors 212. The spacer 204 includes a web 220 having a first side 222, a second side 224, and a plurality of openings 226. The first side 222 is spaced apart from the second side 224 by a thickness "T" at least approximately equal to a desired separation distance between the imager workpiece 202 and the cover substrate 206. The openings 226 are arranged in the die pattern so that the image sensors 212 are aligned with corresponding openings 226. The cover substrate 206 is a plate composed of a material through which a desired radiation for the image sensor 212 can propagate. The cover substrate 206, for example, can be quartz, glass, or another type of optically transparent material. The cover substrate 206 is generally a second substrate having the same or similar shape as the first substrate 210. Additionally, the cover substrate 206 is adhered to the second side 224 of the web 220 to enclose the image sensors 212 in corresponding compartments defined by the openings 226.

The web 220 of the spacer can be a prefabricated unit that is constructed separately from the imager workpiece 202 and the cover substrate 206, or the web 220 can be constructed on one of the imager workpiece or cover substrate 206. The web 220 is composed of a material that is not cured after the imager workpiece and the cover substrate have both been adhered to the spacer. As such, the spacer 204 is a dimensionally stable component with precise dimensions.

The imager assembly 200 illustrated in FIG. 2 is expected to provide several advantages compared to conventional imaging assemblies having conventional spacers, as shown above with reference to FIG. 1. For example, because the web 220 is not cured after the imager workpiece 202 and the cover substrate 206 have both been adhered to the spacer 204, the web 220 does not outgas contaminants into the openings 226 after the image sensors 212 have been fully enclosed. Additionally, the spacer 204 can be composed of a substantially incompressible material and the openings 226 can be cut into the web 220 such that the spacer 204 has a controlled thickness and the openings 226 have well-defined "cut-edge" sidewalls 228. The spacer 204 accordingly provides a dimensionally stable and highly accurate interface between the imager workpiece 202 and the cover substrate 206. Moreover, the second side 226 of the web 220 can be highly planar such that it provides an extremely good seal with the cover substrate 206 to avoid leaks. FIGS. 3–7B illustrate several specific embodiments of spacers that provide several of these advantages and additional benefits as set forth below.

Figure 3:
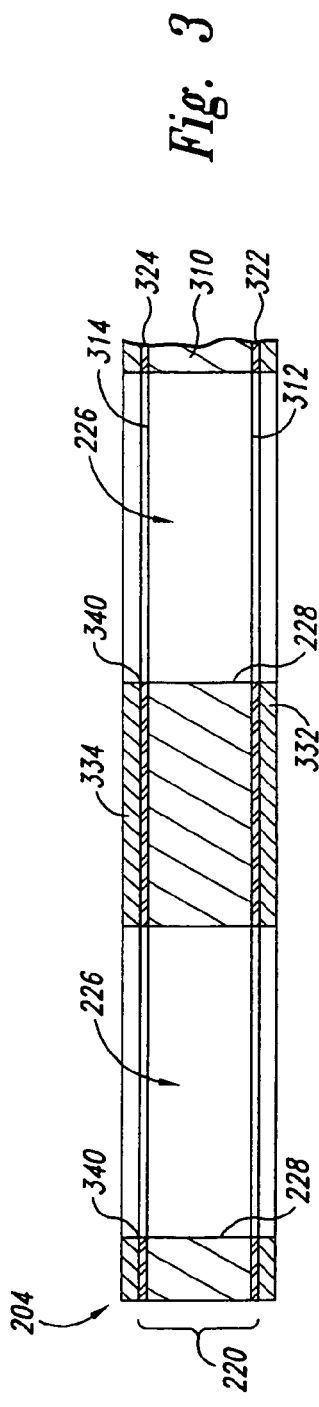
FIG. 3 is a cross-sectional view taken along line A—A of FIG. 2 illustrating a portion of a spacer for use in wafer-level packaging of microelectronic imagers in accordance with an embodiment of the invention.

C. Embodiments of Spacers for Wafer-Level Packaging of Microelectronic Imagers FIG. 3 is a cross-sectional view illustrating a portion of one embodiment of the spacer 204. In this embodiment, the web 220 includes a film 310 having a first side 312 and a second side 314. The web 220 further includes a first adhesive 322 on the first side 312 of the film 310, and a second adhesive 324 on the second side 314 of the film 310. The embodiment of the spacer 204 illustrated in FIG. 3 further includes a first release element 332 over the first adhesive 322 and a second release element 334 over the second adhesive 324. The first and second release elements 332 and 334 can be peeled away from the first and second adhesives 322 and 324, respectively, to expose the adhesives before attaching the imager workpiece 202 (FIG. 2) and the cover substrate 206 (FIG. 2) to the spacer 204.

The embodiment of the spacer 204 shown in FIG. 3 can be fabricated by coating a sheet of the film 310 with the first and second adhesives 322 and 324, and subsequently applying the release elements 332 and 334 to the first and second adhesives 322 and 324. In another embodiment, the first and second adhesives 322 and 324 can be applied to the first and second release elements 332 and 334, respectively, and then the assembly of the adhesives and release elements can be rolled onto a sheet of the film 310. The spacer 204 can then be completed by forming the openings 226. The openings 226 are generally cut through the release elements, adhesives and the film to form cut edges 340 along the sidewalls 228. The holes 226 can be cut using a punch/die stamp, a knife-edged stamp or roller, lasers and/or water jets.

The film 310 and the adhesives 322 and 324 can be made from several different materials. In one embodiment, the film 310 is a tape that is either in a precured or post-cured state. Suitable tapes include polyimide films, polyester films, ultra-high molecular weight films, PTFE films, and other suitable materials. Such materials are readily available from Tapes II International located in Santa Ana, Calif. The adhesives can be any suitable adhesives used in the semiconductor packaging industry or elsewhere.

Figure 4:
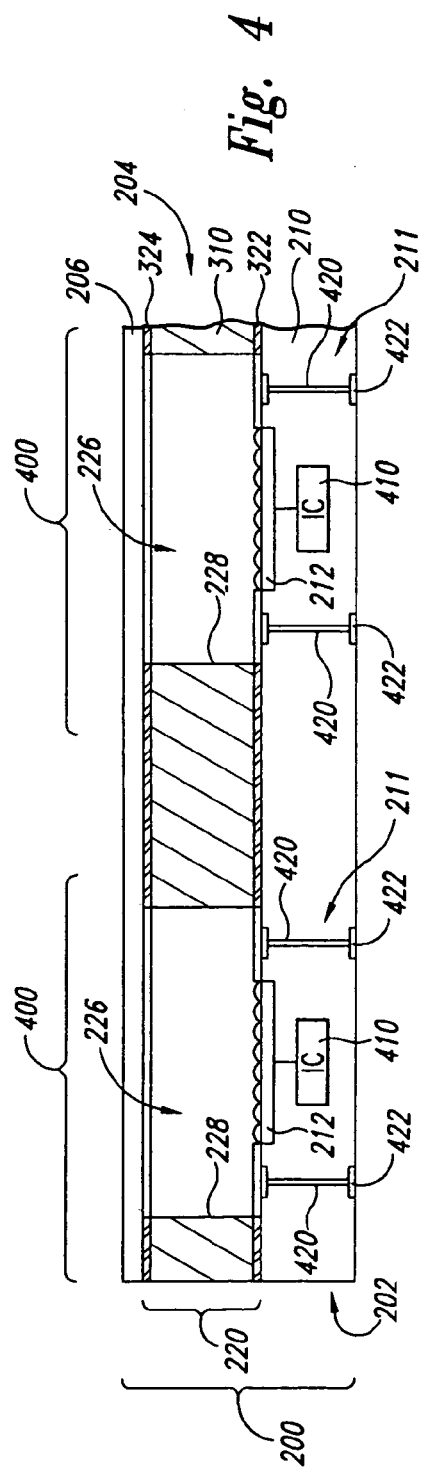
FIG. 4 is a cross-sectional view illustrating a plurality of microelectronic imagers that have been packaged with the spacer shown in FIG. 3 in accordance with an embodiment of the invention.

FIG. 4 is a cross-sectional view illustrating a portion of the imager assembly 200 after the imager workpiece 202 and the cover substrate 206 have been adhered to the spacer 204. The imager assembly 200 includes a plurality of individual imagers 400 that have an imaging die 211 aligned with an opening 226 in the spacer 204. In this embodiment, individual imaging dies 211 include an image sensor 212, an integrated circuit 410 operatively coupled to the image sensor 212, and external contacts 420 operatively coupled to the integrated circuit 410. The external contacts 420 illustrated in FIG. 4 are through-wafer interconnects having external contacts pad 422 at the backside of the first substrate 210.

The imager assembly 200 is assembled by removing the first release element 332 from the first adhesive 322 and aligning the openings 226 with corresponding image sensors 212. The first adhesive 322 is then adhered to the imager workpiece 202. The second release element 334 is subsequently removed from the second adhesive 324, and the cover substrate 206 is adhered to the second adhesive 324. This process can be reversed such that the second side 314 of the film 310 is adhered to the cover substrate 206 before the first side 312 of the film 310 is adhered to the imager workpiece 202.

The imager assembly 200 is constructed by assembling the imager workpiece 202 and the cover substrate 206 with the web 310 after the web 310 is in a state that does not require subsequent curing. The web 310, therefore, is not cured after the imager workpiece 202 and the cover substrate 206 have both been adhered to the spacer 204 and the image sensors 212 have been enclosed in the openings 226. As such, the web 310 is incompressible and/or in an otherwise non-flowable state when the imager workpiece 202 and the cover substrate 206 are both adhered to the spacer 204.

The imager assembly 200 is expected to provide several benefits compared to conventional processes and devices for spacing the cover apart from the image sensors. First, because the web 310 is not cured after sealing the imager workpiece 202 and the cover substrate 206 to the web 310, the spacer 204 does not significantly outgas into the openings 226 enclosing the image sensors 212. This is expected to significantly reduce the contaminants and enhance the quality of the imagers 400. The spacer 204 is also dimensionally stable when the imager workpiece 202 and the cover substrate 206 are attached to the spacer 204. This is expected to provide highly accurate spacing between the imager workpiece 202 and the cover substrate 206. Moreover, cutting the web 310 to form the openings is a relatively inexpensive process.

Figure 5:
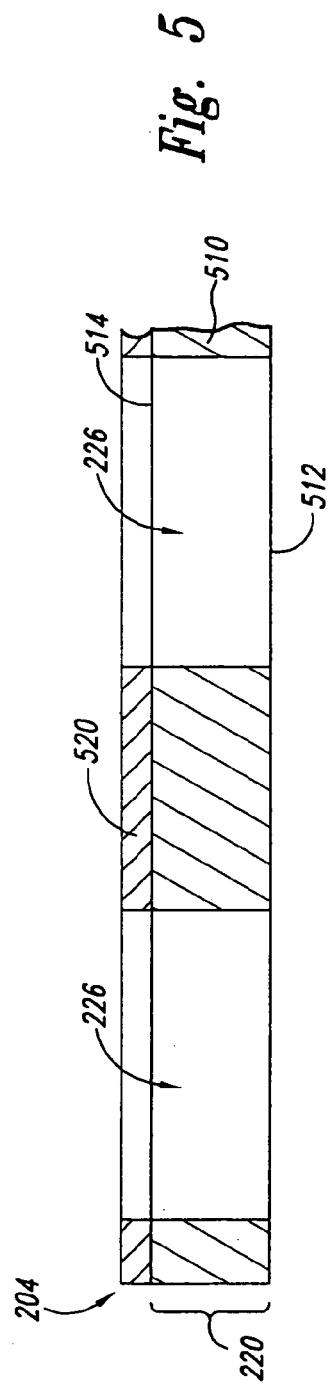
FIG. 5 is a cross-sectional view illustrating a portion of a spacer for use in packaging microelectronic imagers in accordance with another embodiment of the invention.

FIG. 5 is a cross-sectional view illustrating another embodiment of the cover 204 that can be used in an imager assembly. In this embodiment, the cover 204 includes a film 510 and a backing 520 that carries the film 510. The film 510 is an adhesive with a first side 512 and a second side 514 spaced apart from the first side 512 by a distance approximately equal to the desired spacing between the imager workpiece 202 and the cover substrate 206. The film 510 is either formed on the backing 520 by depositing a layer of adhesive in a flowable state and then curing the adhesive before presenting the cover 204 to the imager workpiece 202. Alternatively, the film 510 can be formed in a molding procedure separately from the backing 520 and then attached to the backing 520. The openings 226 can be formed in the film 510 using a stamping or cutting procedure as described above with reference to FIG. 3, or the openings 226 can be molded.

The embodiment of the cover 204 illustrated in FIG. 5 can be assembled with the imager workpiece 202 (FIG. 2) and the cover substrate 206 (FIG. 2) by attaching the first side 512 of the web 510 to the imager workpiece 202 such that the openings 226 are aligned with the image sensors 212 (FIG. 4). The backing 520 is then removed from the second side 514 of the web 510. The backing can be removed by peeling it from the web 510. For example, the web 510 can be composed of a UV-activated material that responds to ultraviolet radiation such that the backing 520 can be removed from the second side 514 of the web 510. The cover substrate 206 is attached to the second side 514 of the web 510 after removing the backing 520. Alternatively, the film 510 can be attached to the cover substrate 206 first, and then the imager workpiece 202 can be attached to the other side of the film 510.

Figure 6A:
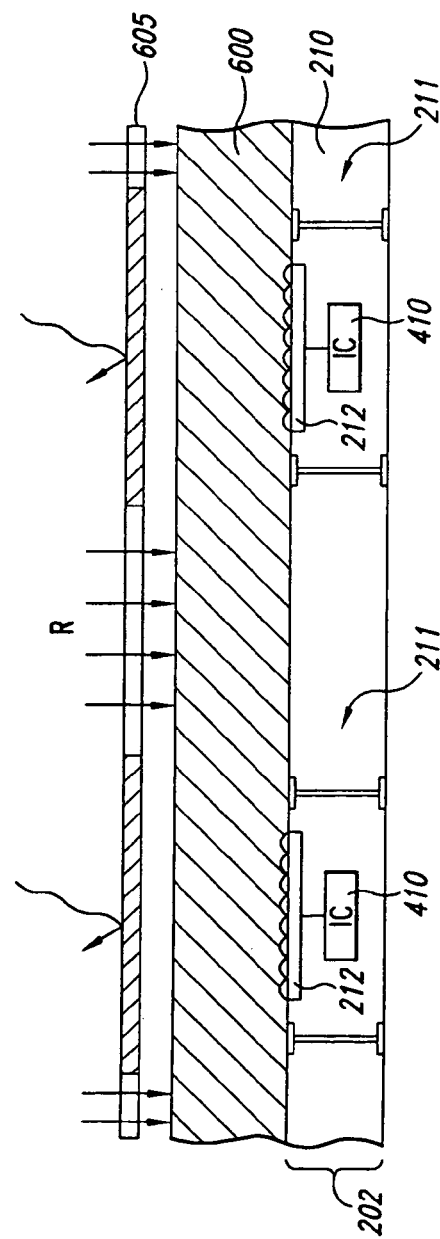
FIGS. 6A–6C are cross-sectional views illustrating a method of wafer-level packaging of microelectronic imagers in accordance with additional embodiments of the invention.
Figure 6B:
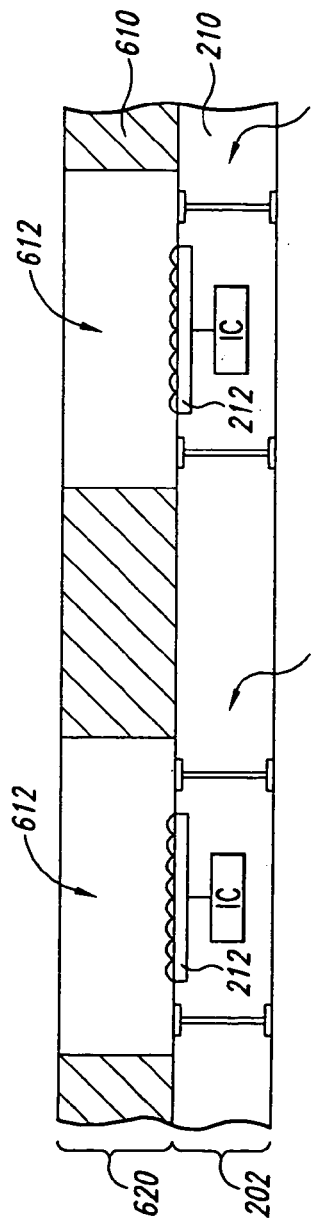
Figure 6C:
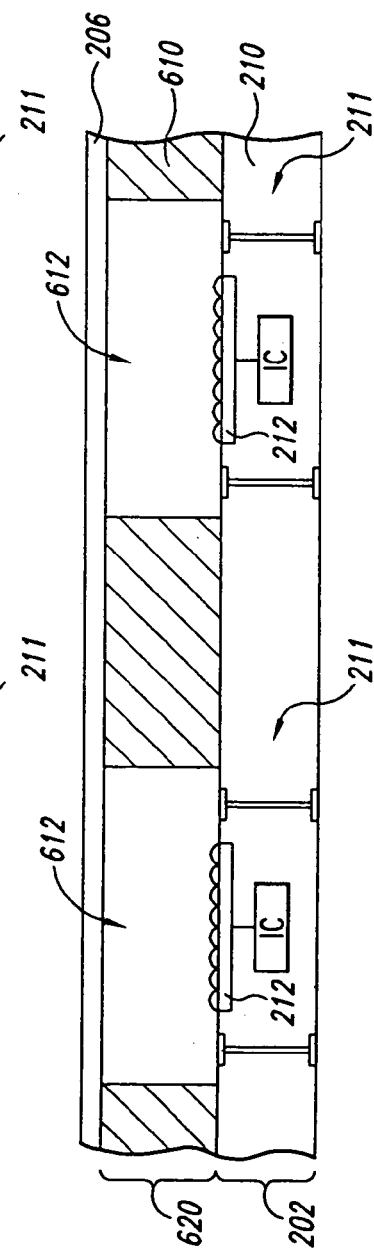

FIGS. 6A–6C are cross-sectional views illustrating sequential stages of a method for producing a spacer on an imager assembly in accordance with another embodiment of the invention. Referring to FIG. 6A, this process includes covering the imager workpiece 202 with a layer of web material 600. The web material 600 can be a photosensitive dry film adhesive or a liquid adhesive in a flowable state. In one embodiment, the adhesive can include photopatternable polydimethylsiloxane (PDMS) that can be activated by an $O_2$ plasma. Other embodiments can use liquid or dry adhesives that can be rolled, sprayed or applied to the workpiece using other techniques. After depositing the adhesive 600 onto the imager workpiece 202, the adhesive 600 is patterned using a mask 605 and an appropriate radiation R to cure the exposed portions of the adhesive 600.

FIG. 6B illustrates a subsequent stage in the method at which a web 610 is formed from the adhesive 600 by removing the unexposed portions of the adhesive 600 to create a plurality of openings 612 aligned with the image sensors 212. The web 610 and openings 612 together define a spacer 620. In the case of PDMS, the exposed upper surface of the web 610 is then activated for adhesion using an $O_2$ plasma. Referring to FIG. 6C, the cover substrate 206 is then attached to the activated upper surface of the web 610 to enclose the image sensors 212 in the opening 612.

The method described above with reference to FIGS. 6A–6C can have several different embodiments. For example, the method can further include cleaning the image sensors 212 after forming the openings 612 to remove any contaminants generated while forming the openings 612. In another embodiment, the adhesive 600 can be deposited onto the cover substrate 206 and then the openings 612 can be formed in the adhesive 600 to fabricate the spacer 620 on the cover substrate 206 instead of the imager workpiece 202. It follows that the bottom surface of the web 610 can be activated using an appropriate plasma, and the imager workpiece 202 can be attached to the activated bottom surface of the web 610.

Figure 7A:
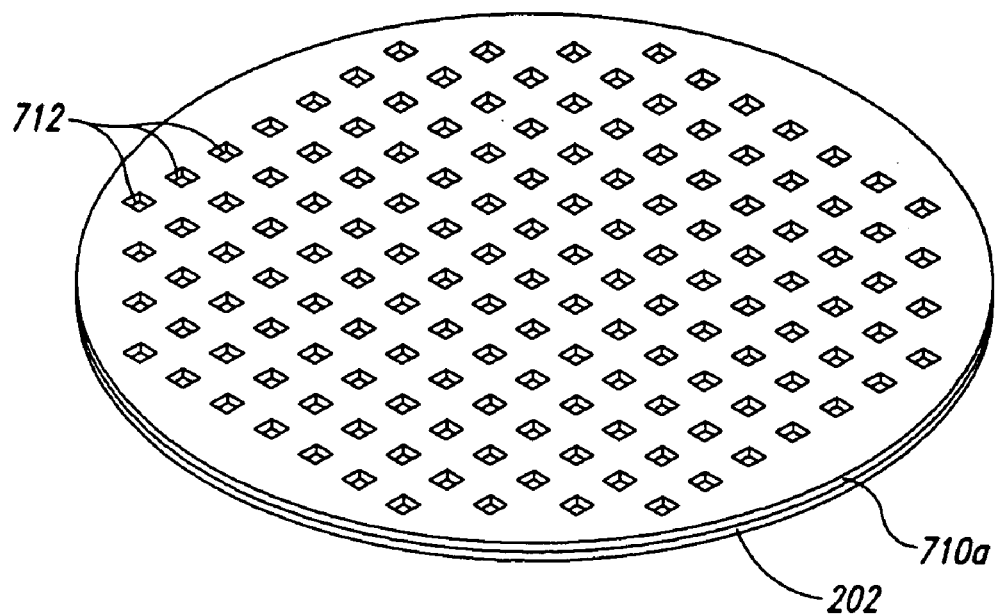
FIGS. 7A and 7B are isometric views illustrating different embodiments of spacers on imaging workpieces in accordance with the invention.
Figure 7B:
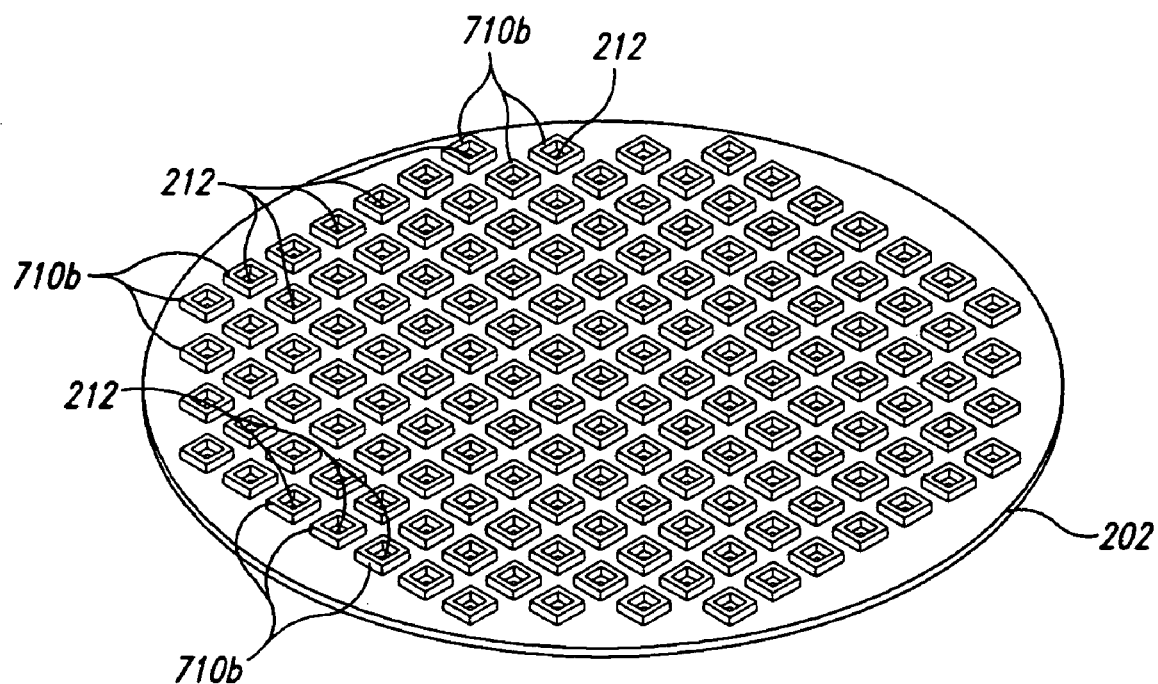

FIGS. 7A and 7B illustrate different configurations of the spacers for use in imager assemblies in accordance with additional embodiments of the invention. Referring to FIG. 7A, any of the spacers described above can be a grid 710a having openings 712 aligned with image sensors (not shown in FIG. 7A) on the imager workpiece 202. Alternatively, FIG. 7B illustrates a different embodiment in which any of the spacers described above with reference to FIGS. 2–6C are defined by frames 710b surrounding individual image sensors 212 on the imager workpiece 202. The frames 710b can be formed on a backing as described above with reference to FIG. 5 or a deposition/pattern process as described in FIGS. 6A–6B. Additionally, the frames 710b can be formed on the cover substrate instead of the imager workpiece 202. One aspect of the frames 710b is that the lanes between the image sensors 212 are not covered by the spacers. This is expected to be advantageous for cutting the imager workpiece 202 because there is less material in the lanes between the image sensors 212.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A method of packaging a plurality of imager dies arranged in a die pattern on a workpiece, wherein individual imager dies include an image sensor and an integrated circuit operatively coupled to the image sensor, the method comprising:
   providing a spacer having a web including an adhesive and a plurality of openings arranged corresponding to the die pattern; and
   adhering (a) the workpiece to one side of the spacer with the image sensors being aligned with the openings, and (b) a cover substrate to an opposite side of the spacer such that the image sensors are enclosed in individual compartments within the openings in the web, wherein the web is composed of a material in a state that does not require subsequent curing after the workpiece and the cover substrate have both been assembled with the spacer.

2. The method of claim 1 wherein providing the spacer comprises producing a spacer including a film having a first side and a second side, a first adhesive on the first side, a second adhesive on the second side, a first release element on the first adhesive, and a second release element on the second adhesive, and wherein the openings are cut-edged holes with straight sidewalls through the film.

3. A method of packaging a plurality of imager dies arranged in a die pattern on a workpiece, wherein individual imager dies include an image sensor and an integrated circuit operatively coupled to the image sensor, the method comprising:
providing a spacer having a web including an adhesive and a plurality of openings arranged corresponding to the die pattern; and
adhering (a) the workpiece to one side of the spacer with the image sensors being aligned with the openings, and (b) a cover substrate to an opposite side of the spacer such that the image sensors are enclosed in individual compartments within the openings in the web,
wherein providing the spacer comprises producing a spacer including a film having a first side and a second side, a first adhesive on the first side, a second adhesive on the second side, a first release element on the first adhesive, and a second release element on the second adhesive, and wherein the openings are cut-edged holes with straight sidewalls through the film, and
wherein producing the spacer comprises cutting the openings through the film, the first adhesive and the second adhesive.

4. The method of claim 2 wherein cutting the film and the first and second adhesives comprises stamping, shearing, slicing, water jetting and/or laser cutting.

5. The method of claim 2 wherein adhering the imager workpiece and the cover substrate to the spacer comprises removing the first and second release elements from the first and second adhesives, pressing the imager workpiece against the first adhesive with the image sensors aligned with the openings, and pressing the cover substrate against the second adhesive.

6. The method of claim 1 wherein providing the spacer comprises producing a spacer having an adhesive having a first side and a second side spaced apart from the first side by a desired spacing between the imager workpiece and the cover substrate, a backing on the second side of the adhesive, and wherein the openings are in the adhesive.

7. The method of claim 6 wherein producing the spacer further comprises cutting the openings through the adhesive and the backing.

8. The method of claim 6 wherein adhering the imager workpiece and the cover substrate to the spacer comprises attaching one of the imager workpiece or the cover substrate to the first side of the adhesive, removing the backing from the second side of the adhesive, and attaching the other of the imager workpiece or the cover substrate to the second side of the adhesive.

9. A method of packaging a plurality of imager dies arranged in a die pattern on a workpiece, wherein individual imager dies include an image sensor and an integrated circuit operatively coupled to the image sensor, the method comprising:
providing a spacer having a web including an adhesive and a plurality of openings arranged corresponding to the die pattern; and
adhering (a) the workpiece to one side of the spacer with the image sensors being aligned with the openings, and (b) a cover substrate to an opposite side of the spacer such that the image sensors are enclosed in individual compartments within the openings in the web,
wherein providing the spacer comprises producing the spacer by coating one of the imager workpiece or the cover substrate with an adhesive, photo-patterning the adhesive in a pattern corresponding to the arrangement of the image sensors on the imager workpiece, and removing areas of the adhesive to form the openings in the arrangement of the image sensors on the imager workpiece.

10. The method of claim 9 further comprising activating the adhesive before the imager workpiece and the cover substrate are both adhered to the spacer.

11. The method of claim 9 wherein coating one of the imager workpiece or the cover substrate with an adhesive comprises depositing a liquid adhesive in a flowable state onto the one of the imager workpiece or the cover substrate and hardening the liquid adhesive before enclosing the image sensors between the imager workpiece and the cover substrate.

12. The method of claim 9 wherein coating one of the imager workpiece or the cover substrate with an adhesive comprises depositing a dry adhesive in an unactivated state onto the one of the imager workpiece or the cover substrate and activating the dry adhesive before enclosing the image sensors between the imager workpiece and the cover substrate.

13. The method of claim 9 further comprising cleaning the one of the imager workpiece or the cover substrate after removing the areas of the adhesive, and attaching the other of the imager workpiece or the cover substrate to the adhesive.

14. A method of packaging microelectronic imagers, comprising:
providing an imager workpiece having a plurality of imager dies and lanes between the imager dies, the imager dies including image sensors and integrated circuitry coupled to the image sensors;
providing a cover substrate through which a desired radiation for the image sensors can propagate;
providing a spacer having a web with openings arranged to be aligned with the image sensors, the web including an adhesive; and
assembling the imager workpiece with the cover substrate such that (a) the spacer is between the imager workpiece and the cover substrate, and (b) the openings are aligned with the image sensors, wherein the web is composed of a material in a state that does not require subsequent curing after the imager workpiece and the cover substrate have both been assembled with the spacer.

15. The method of claim 14 wherein providing the spacer comprises producing a spacer including a film having a first side and a second side, a first adhesive on the first side, a second adhesive on the second side, a first release element on the first adhesive, and a second release element on the second adhesive, and wherein the openings are cut-edged holes with straight sidewalls through the film.

16. The method of claim 15 wherein producing the spacer comprises cutting the openings through the film, the first adhesive and the second adhesive.

17. The method of claim 15 wherein cutting the film and the first and second adhesives comprises stamping, shearing, slicing, water jetting and/or laser cutting.

18. The method of claim 15 wherein assembling the imager workpiece and the cover substrate with the spacer comprises removing the first and second release elements from the first and second adhesives, pressing the imager workpiece against the first adhesive with the image sensors aligned with the openings, and pressing the cover substrate against the second adhesive.

19. The method of claim 14 wherein providing the spacer comprises producing a spacer having an adhesive having a first side and a second side spaced apart from the first side by a desired spacing between the imager workpiece and the cover substrate, a backing on the second side of the adhesive, and wherein the openings are in the adhesive.

20. The method of claim 19 wherein assembling the imager workpiece and the cover substrate with the spacer comprises attaching one of the imager workpiece or the cover substrate to the first side of the adhesive, removing the backing from the second side of the adhesive, and attaching the other of the imager workpiece or the cover substrate to the second side of the adhesive.

21. The method of claim 14 wherein providing the spacer comprises producing the spacer by coating one of the imager workpiece or the cover substrate with an adhesive, photo-patterning the adhesive in a pattern corresponding to the arrangement of the image sensors on the imager workpiece, and removing areas of the adhesive to form the openings in the arrangement of the image sensors on the imager workpiece.

22. The method of claim 21 further comprising activating the adhesive before the imager workpiece and the cover substrate are both adhered to the spacer.

23. The method of claim 21 wherein coating one of the imager workpiece or the cover substrate with an adhesive comprises depositing a liquid adhesive in a flowable state onto the one of the imager workpiece or the cover substrate and hardening the liquid adhesive before enclosing the image sensors between the imager workpiece and the cover substrate.

24. The method of claim 21 wherein coating one of the imager workpiece or the cover substrate with an adhesive comprises depositing a dry adhesive in an unactivated state onto the one of the imager workpiece or the cover substrate and activating the dry adhesive before enclosing the image sensors between the imager workpiece and the cover substrate.

25. The method of claim 21 further comprising cleaning the one of the imager workpiece or the cover substrate after removing the areas of the adhesive, and attaching the other of the imager workpiece or the cover substrate to the adhesive.

26. A method of assembling an imager workpiece having a plurality of imager dies arranged in a die pattern with an optically transmissive cover substrate, wherein individual imager dies include an image sensor and an integrated circuit operatively coupled to the image sensor, the method comprising:
   prefabricating a spacer having a web with a desired thickness to space the imager workpiece apart from the cover substrate by a desired distance, openings arranged corresponding to the die pattern, a substantially flat first side, and a substantially flat second side, wherein the web is composed of a material in a non-flowable state before enclosing the image sensor between the imager workpiece and the cover substrate; and
   sealing (a) the imager workpiece to the first side of the web such that individual image sensors are aligned with a corresponding opening in the web, and (b) sealing the cover substrate to the second side of the web opposite the first side to enclose the image sensors in the openings between the imager workpiece and the cover substrate.

27. The method of claim 26 wherein prefabricating the spacer comprises coating a film having a first side and a second side with a first adhesive on the first side and a second adhesive on the second side, and placing a first release element on the first adhesive and a second release element on the second adhesive, and wherein the openings are cut-edged holes with straight sidewalls through the film.

28. The method of claim 26 wherein prefabricating the spacer comprises forming an adhesive layer having a first side and a second side spaced apart from the first side by a desired spacing between the imager workpiece and the cover substrate, a backing on the second side of the adhesive, and wherein the openings are in the adhesive.

29. The method of claim 26 wherein prefabricating the spacer comprises coating one of the imager workpiece or the cover substrate with an adhesive, photo-patterning the adhesive in a pattern corresponding to the arrangement of the image sensors on the imager workpiece, and removing areas of the adhesive to form the openings in the arrangement of the image sensors on the imager workpiece.

30. A method of producing a spacer for separating an imager workpiece having a plurality of dies with image sensors arranged in a die pattern from a cover substrate that is transmissive to a desired radiation, the method comprising:
   producing a non-flowable incompressible film having a first flat surface and a second flat surface spaced apart from the first flat surface by a thickness at least approximately equal to a desired distance between the imager workpiece and the cover substrate;
   forming openings in the non-flowable incompressible film in the die pattern; and
   coating the first flat surface with a first adhesive and the second flat surface with a second adhesive and subsequently applying release elements to the first adhesive and the second adhesive.

31. The method of claim 30 wherein the non-flowable film is a tape.

32. A method of producing a spacer for separating an imager workpiece having a plurality of dies with image sensors arranged in a die pattern from a cover substrate that is transmissive to a desired radiation, the method comprising:
   producing a non-flowable incompressible film having a first flat surface and a second flat surface spaced apart from the first flat surface by a thickness at least approximately equal to a desired distance between the imager workpiece and the cover substrate;
   forming openings in the non-flowable incompressible film in the die pattern; and
   coating the film with an adhesive,
   wherein the non-flowable film comprises a tape composed of a polyimide film, a polyester film, an ultra high molecular weight film and/or a PTFE film.

33. A method of producing a spacer for separating an imager workpiece having a plurality of dies with image sensors arranged in a die pattern from a cover substrate that is transmissive to a desired radiation, the method comprising:
   producing a non-flowable incompressible film having a first flat surface and a second flat surface spaced apart from the first flat surface by a thickness at least approximately equal to a desired distance between the imager workpiece and the cover substrate;
   forming openings in the non-flowable incompressible film in the die pattern; and
   coating the film with an adhesive,
   wherein coating the film with an adhesive comprises rolling a first layer of adhesive onto the first flat surface of the film and rolling a second layer of adhesive onto the second flat surface of the film.

34. A method of producing a spacer for separating an imager workpiece having a plurality of dies with image sensors arranged in a die pattern from a cover substrate that is transmissive to a desired radiation, the method comprising:
 producing a non-flowable incompressible film having a first flat surface and a second flat surface spaced apart from the first flat surface by a thickness at least approximately equal to a desired distance between the imager workpiece and the cover substrate;
 forming openings in the non-flowable incompressible film in the die pattern; and
 coating the film with an adhesive,
 wherein coating the film with an adhesive comprises spraying a first layer of adhesive onto the first flat surface of the film and spraying a second layer of adhesive onto the second flat surface of the film.

35. The method of claim 30 wherein forming the openings in the film comprises cutting openings through the film and the adhesive.

36. The method of claim 30 wherein forming the openings in the film comprises cutting openings through the film and the adhesive by shearing, stamping, slicing, water jetting and/or laser cutting.

37. The method of claim 30 wherein forming the openings in the film comprises molding the film with openings arranged in the die pattern.

* * * * *